United States Patent

Negishi et al.

[11] Patent Number: 5,834,774
[45] Date of Patent: Nov. 10, 1998

[54] SCANNING ELECTRON MICROSCOPE

[75] Inventors: Tsutomu Negishi; Toshiharu Kobayashi, both of Tokyo, Japan

[73] Assignee: JEOL Ltd., Tokyo, Japan

[21] Appl. No.: 899,914

[22] Filed: Jul. 24, 1997

[30] Foreign Application Priority Data

Jul. 24, 1996 [JP] Japan .................................. 8-194447

[51] Int. Cl.$^6$ .................................................. H01J 37/26
[52] U.S. Cl. ............................................................ 250/310
[58] Field of Search .................................. 250/310, 306, 250/307, 397

[56] References Cited

U.S. PATENT DOCUMENTS

| | | | |
|---|---|---|---|
| 4,020,343 | 4/1977 | Shimaya et al. | 250/310 |
| 4,071,759 | 1/1978 | Namae | 250/310 |
| 4,439,681 | 3/1984 | Norioka et al. | 250/310 |
| 5,412,209 | 5/1995 | Otaka et al. | 250/310 |

FOREIGN PATENT DOCUMENTS

| | | |
|---|---|---|
| 51-36150 | 3/1976 | Japan . |
| 7-130321 | 1/1995 | Japan . |
| 7-262950 | 2/1995 | Japan . |
| 7-220668 | 11/1995 | Japan . |

*Primary Examiner*—Kiet T. Nguyen
*Attorney, Agent, or Firm*—Webb Ziesenheim Bruening Logsdon Orkin & Hanson, P.C.

[57] ABSTRACT

There is disclosed a scanning electron microscope for producing images at different magnifications in such a way that these images can be easily compared. This microscope has a control unit that is set at two magnifications. These two magnifications are stored in their respective magnification memories. A first frame used for a comparison of the magnifications is displayed in a size $F_1$ on a first CRT. A second frame used for a comparison of the magnifications is displayed in a size $F_2$ on a second CRT. A magnification comparator finds these sizes $F_1$ and $F_2$ from the two magnifications and from the sizes of the viewing screens of the two CRTs. Signals indicating the sizes $F_1$ and $F_2$ are supplied to a magnification comparison frame display device, which produces frame signals to adders, where the frame signals are superimposed on the image signals. A frame indicating the scope of the image displayed on the second CRT is displayed on the first CRT. A frame indicating the scope of the image displayed on the first CRT is displayed on the second CRT.

10 Claims, 4 Drawing Sheets

SCANNING ELECTRON MICROSCOPE

FIELD OF THE INVENTION

The present invention relates to a scanning electron microscope which can display two images with different magnifications simultaneously and which permits the observer to see the scope of the higher-magnification image within the lower-magnification image.

BACKGROUND OF THE INVENTION

In the prior art scanning electron microscope, the electron gun produces a primary electron beam that is sharply focused onto a specimen by a condenser lens system and by an objective lens. The primary electron beam is scanned in two dimensions across the specimen by scanning coils. The impingement of the electron beam on the specimen produces secondary electrons and other electrons that are detected by a detector. The output signal from the detector is supplied to a CRT, so that a secondary electron image or other image is displayed on the CRT.

With this scanning electron microscope, when the operator wants to compare images produced at different magnifications, a known technique for displaying the same field of view at different magnifications at the same time is available. This technique is disclosed in Japanese Patent Publication No. 36150/1976. In particular, the operator specifies a region in the lower-magnification image. A magnified image of this specified region is displayed within the other image. Therefore, it is necessary to determine the lower magnification first. Then, the magnification factor of the magnified image, i.e., the higher magnification, must be determined. However, in ordinary scanning electron microscopy, the microscope operator makes various attempts by trial and error to obtain useful information from unknown specimens. Therefore, if the operator wants to switch the presently observed magnified image to the lower-magnification image (i.e., in a manner opposite to the above-described prior art sequence in which the lower magnification is first established and then the higher magnification is established), he often wants to confirm to what portion of the lower-magnification image does the presently observed image correspond.

Sometimes, the operator wants to sequentially switch the second magnification of the second image over a wide range from a value lower than the first fixed magnification of the first image to a value higher than the first magnification while keeping displaying the first image of the specimen to obtain various kinds of information about the specimen under investigation, e.g., information about the surroundings of the centered region of the specimen and information about the microstructures of the specimen.

Furthermore, the operator may consider that details similar to the currently observed specimen detail seen on the magnified image exist outside the magnified image. At this time, he wants to search the specimen for the similar details by sequentially switching the field of view of the lower-magnification image while referring to the magnified image.

SUMMARY OF THE INVENTION

In view of the foregoing requirements, the present invention has been made. It is an object of the present invention to provide a scanning electron microscope that permits an operator to easily compare images produced at different magnifications.

One embodiment of the present invention lies in a scanning electron microscope having an electron gun for producing and accelerating an electron beam, electron lenses for focusing the electron beam onto a specimen, and scanning means for scanning the electron beam across the specimen in two dimensions to produce signals. Images are displayed according to the produced signals. This microscope is characterized in that it displays images produced at different magnifications simultaneously and that the magnification of one image can be varied at will irrespective of the magnification of the other image. Moreover, the scope of the higher-magnification image is always displayed within the lower-magnification image.

Another embodiment of the present invention lies in a scanning electron microscope having an electron gun for producing and accelerating an electron beam, electron lenses for focusing the electron beam onto a specimen, and scanning means for scanning the electron beam across the specimen in two dimensions to produce signals. Images are displayed according to the produced signals. This microscope is characterized in that it further includes two frame buffers (also known as framestores) for storing signals representing images produced at two different magnifications $M_1$ and $M_2$, a display means for displaying two kinds of images produced at different magnifications according to signals from the frame buffers, a calculational means for finding the ratios $M_1/M_2$ and $M_2/M_1$ from the two magnifications, a first superimposing means for superimposing a first discerning signal on an image signal representing the image produced at the magnification $M_1$, and a second superimposing means for superimposing a second discerning signal on an image signal representing the image produced at the magnification $M_2$. The first and second discerning signals indicate the scopes in which these two images are respectively displayed, and are created from the ratios $M_1/M_2$ and $M_2/M_1$, respectively.

A further embodiment of the present invention lies in a scanning electron microscope having an electron gun for producing and accelerating an electron beam, electron lenses for focusing the electron beam onto a specimen, and scanning means for scanning the electron beam across the specimen in two dimensions to produce signals. Images are produced according to the produced signals. This microscope is characterized in that it further includes two frame buffers for storing signals representing images produced at two different magnifications $M_1$ and $M_2$, a display means for displaying two kinds of images produced at different magnifications according to signals from the frame buffers, a calculational means for calculating the ratio of the lower magnification to the higher magnification, and a superimposing means for superimposing a discerning signal on the signal representing the lower-magnification image. The discerning signal indicates the displayed scope of the lower-magnification image, and is created from the calculated ratio.

A still other embodiment of the present invention lies in a scanning electron microscope having an electron gun for producing and accelerating an electron beam, electron lenses for focusing the electron beam onto a specimen, and scanning means for scanning the electron beam across the specimen in two dimensions to produce signals. Images are produced according to the produced signals. This microscope is characterized in that it further includes a frame buffer for storing a signal representing one image produced at one of two different magnifications $M_1$ and $M_2$, a display means for displaying two kinds of images produced at different magnifications according to signals representing two different images, a calculational means for finding the ratios $M_1/M_2$ and $M_2/M_1$ from the two different magnifications, a first superimposing means for superimposing a first discerning signal on an image signal representing the image produced at the magnification $M_1$, and a second superimposing means for superimposing a second discerning signal on an image signal representing the image produced at the magnification $M_2$. The first and second discerning signals indicate the displayed scopes of the images produced at the magnifications $M_2$ and $M_1$, respectively, and are created from the ratios $M_1/M_2$ and $M_2/M_1$, respectively.

A yet other embodiment of the present invention lies in a scanning electron microscope having an electron gun for producing and accelerating an electron beam, electron lenses for focusing the electron beam onto a specimen, and scanning means for scanning the electron beam across the specimen in two dimensions to produce signals. Images are displayed according to the produced signals. This microscope is characterized in that it further includes a frame buffer for storing a signal representing one image produced at one of two different magnifications, a display means for displaying two kinds of images produced at different magnifications according to signals representing two different images, a calculational means for calculating the ratio of the lower magnification to the higher magnification, and a superimposing means for superimposing a discerning signal on the signal representing the lower-magnification image. The discerning signal indicates the displayed scope of the higher-magnification image, and is created from the calculated ratio.

Other objects and features of the invention will appear in the course of the description thereof, which follows.

DESCRIPTION OF THE PREFERRED EMBODIMENTS

Figure 1:
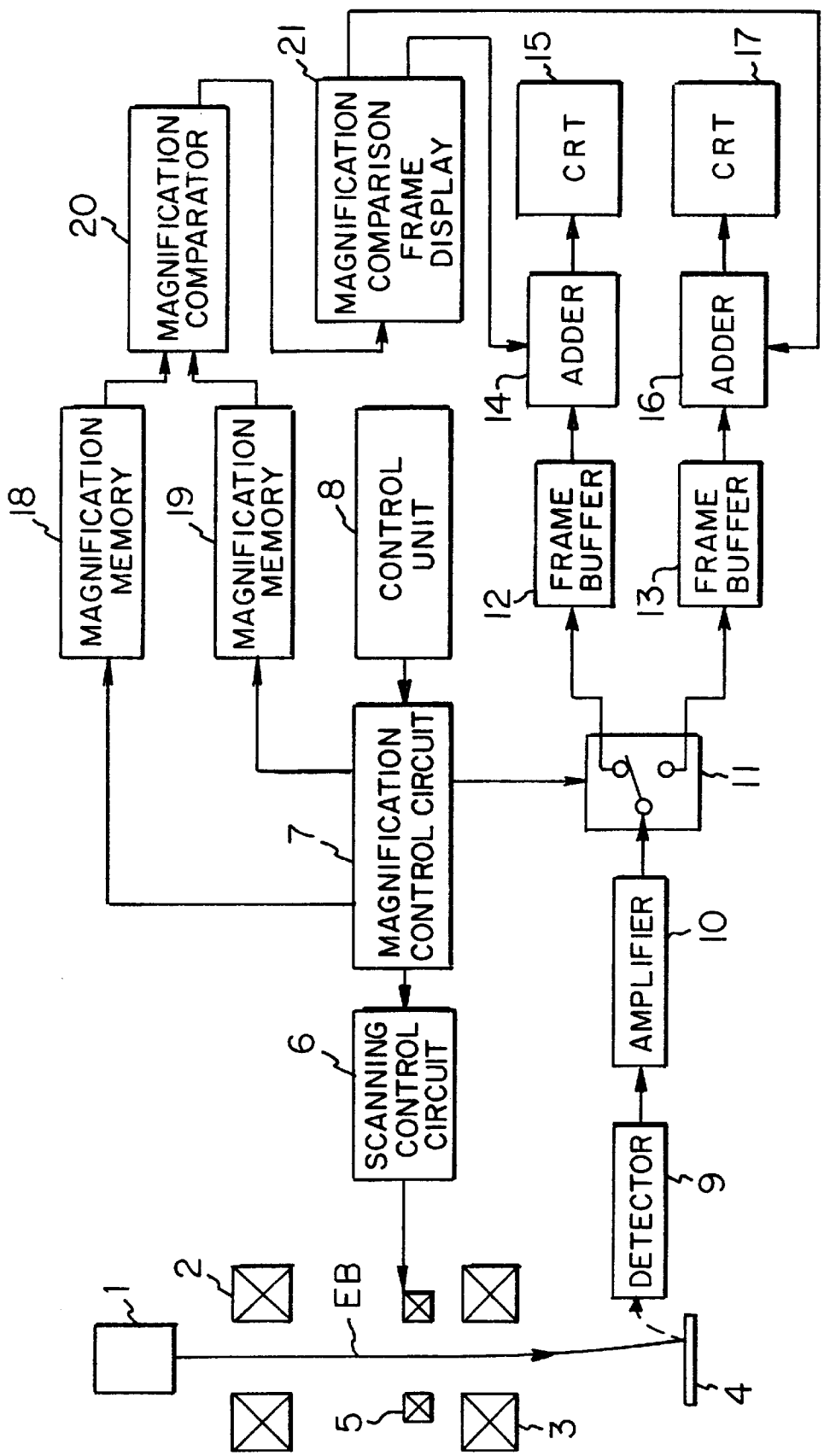
FIG. 1 is a block diagram of a scanning electron microscope in accordance with the present invention.

Referring to FIG. 1, there is shown a scanning electron microscope embodying the concept of the present invention. This instrument has an electron gun 1 that produces and accelerates an electron beam EB, which is sharply focused onto a specimen 4 by a condenser lens system 2 and by an objective lens 3. A scanning signal is supplied to scanning coils 5 to scan the electron beam EB in two dimensions across the surface of the specimen 4.

The scanning signal is supplied from a scanning control circuit 6 to the scanning coils 5. A magnification control circuit 7 produces an output signal to the scanning control circuit 6 so that the amplitude of the scanning signal can be varied at will. Hence, the magnification can be changed at will. The magnification control circuit 7 is under control of a control unit 8 such as a computer.

The electron beam EB impinges on the specimen 4, inducing secondary electrons that are detected by a detector 9. The output signal from the detector 9 is amplified by an amplifier 10 and supplied either to a first frame buffer 12 or to a second frame buffer 13 via a switching circuit 11. The output signal from the amplifier 10 is converted into digital form by an analog-to-digital converter (not shown).

The image signal stored in the first frame buffer 12 is read from this buffer and supplied to an adder 14 and then to a digital-to-analog converter (not shown), which converts its input signal into analog form. The analog image signal from the digital-to-analog converter (not shown) is supplied to a first CRT 15, where a first image is displayed.

The image signal stored -in the second frame buffer 13 is read from an adder 16 and supplied to a digital-to-analog converter (not shown) that converts its input signal into analog form. The analog output signal from this D/A converter is fed to a second CRT 17 so that a second image is displayed on the second CRT 17.

The magnification control circuit 7 sets the magnification at two different values according to instructions from the control unit 8, and controls the scanning control circuit 6. At this time, the magnification values set by the magnification control circuit 7 are supplied to magnification memories 18 and 19, respectively. The magnification signals stored in the magnification memories 18 and 19 are supplied to a magnification comparator 20.

This magnification comparator 20 performs given calculations and supplies results to a magnification comparison frame display device 21, which in turn supplies comparison frame signals for the first CRT 15 and the second CRT 17, respectively, to the adders 14 and 16, respectively. The magnification control circuit 7 produces a magnification-switching signal to switch the state of the switching circuit 11. The operation of this instrument constructed in this way is next described.

When a secondary electron image is to be observed, the electron beam EB from the electron gun 1 is sharply focused onto the specimen 4 by the condenser lens system 2 and by the objective lens 3. Also, the electron beam is scanned across the surface of the specimen 4 in two dimensions by the scanning coils 5. The resulting electrons are detected by the secondary electron detector 9. The output signal from the detector 9 is converted into digital form by the A/D converter (not shown). The digital output signal from this A/D converter is sent either to the first frame buffer 12 or to the second frame buffer 13 via the switching circuit 11. The signal stored in the frame buffer 12 or 13 is read out and supplied to the first CRT 15 or the second CRT 17 via the D/A converter (not shown). As a result, a secondary electron image is displayed on the CRT 15 or 17.

If the microscope operator sets the control unit 8 at a first magnification $M_1$, the magnification control circuit 7 controls the scanning control circuit 6, which in turn supplies a scanning signal having an amplitude corresponding to the magnification to the scanning coils 5. As a result, a specimen region or scope corresponding to the magnification $M_1$ is scanned in two dimensions by the electron beam EB.

The resultant secondary electrons are detected by the detector 9. The output signal from the detector 9 is supplied to the switching circuit 11. The state of the switching circuit 11 is switched by the output signal from the magnification control circuit 7. The output signal from the secondary electron detector 9 is supplied via this switching circuit 11 to the first frame buffer 12, where the data is stored.

Then if the operator sets the control unit 8 at a second magnification $M_2$, the magnification control circuit 7 controls the scanning control circuit 6 according to the magnification $M_2$. A scanning signal having an amplitude according to the magnification is supplied to the scanning coils 5. In consequence, a specimen region or scope corresponding to the magnification $M_2$ is scanned in two dimensions by the electron beam EB, resulting in secondary electrons.

The produced secondary electrons are detected by the detector 9. The output signal from the detector 9 is furnished to the switching circuit 11. The state of the switching circuit 11 is switched by the output signal from the magnification control circuit 7. The output signal from the secondary electron detector 9 is supplied to the second frame buffer 13, where the data is stored.

Two magnification values at which the control unit 8 is set are stored in the magnification memories 18 and 19, respectively. The magnification comparator 20 performs the following two calculations from all of the two magnification values $M_1$, $M_2$, the size $D_1$ of the viewing screen of the first CRT 15, and the size $D_2$ of the viewing screen of the second CRT 17:

$$F_1 = (D_1/D_2) X D_1 X (M_1/M_2)$$

$$F_2 = (D_2/D_1) X D_2 X (M_2/M_1)$$

where $F_1$ is the size of a frame used for a comparison of the magnifications displayed on the first CRT 15 and $F_2$ is the size of a frame used for a comparison of the magnifications displayed on the second CRT 17. A signal indicating the size $F_1$ is supplied to the magnification comparison frame display device 21, which in turn produces a signal indicating a frame according to the size $F_1$ to the adder 14. This adder 14 produces the sum of the output signal from the magnification comparison frame display device 21 and the output signal from the frame buffer 12 that indicates the magnification $M_1$. As a result, an image produced at the magnification $M_1$ is displayed on the first CRT 15 and, at the same time, a frame indicating the scope of the second CRT 17 where the image is displayed is presented.

A signal indicating the size $F_2$ is supplied to the magnification comparison frame display device 21, which in turn produces a signal indicating a frame according to the size $F_2$ to the adder 16. This adder 16 produces the sum of the output signal from the magnification comparison frame display device 21 and the output signal from the frame buffer 13 that indicates the magnification $M_2$. As a result, an image produced at the magnification $M_2$ is displayed on the second CRT 17 and, at the same time, a frame indicating the scope of the first CRT 15 where the image is displayed is presented.

Figure 2A:
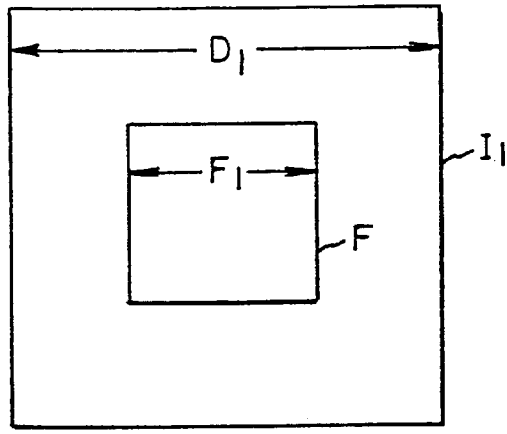
FIGS. 2(a) and 2(b) are views representing SEM images of different magnifications displayed on the viewing screen of a CRT.
Figure 2B:
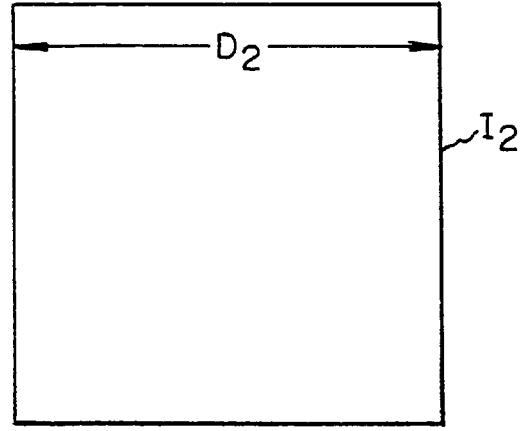

FIG. 2($a$) shows the viewing screen, $I_1$, of the first CRT 15. FIG. 2($b$) shows the viewing screen, $I_2$, of the second CRT 17. In this case, the magnification $M_1$ is lower than the magnification $M_2$.

A frame F having a size $F_1$ is displayed on the viewing screen $I_1$ of the first CRT 15 for the magnification $M_1$.

The instrument is designed so that a frame having a size $F_2$ is displayed on the viewing screen $I_2$ of the second CRT 17 for the magnification $M_2$ but this frame of the size $F_2$ is greater than the size $D_2$ of the viewing screen $I_2$. Therefore, the frame is not displayed in practice.

Figure 3A:
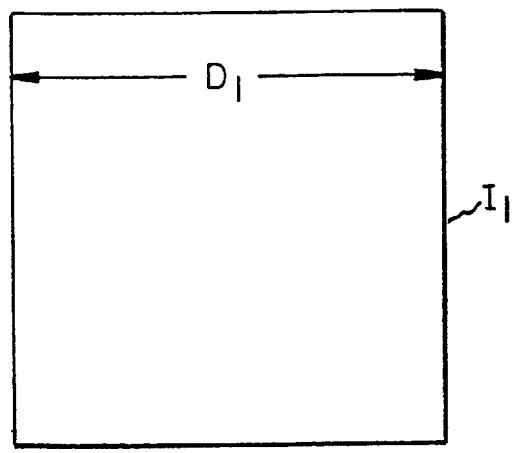
FIGS. 3(a) and 3(b) are views representing images of different magnifications displayed on the viewing screen of a CRT.
Figure 3B:
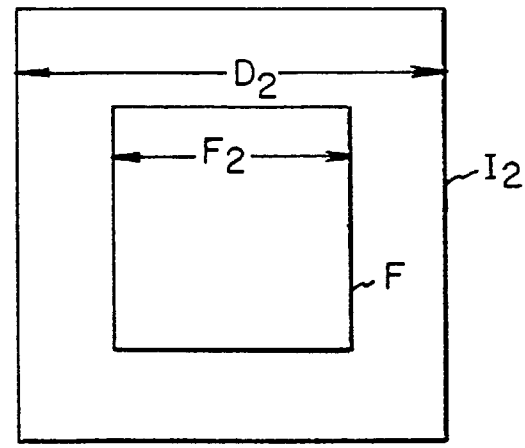
Figure 4A:
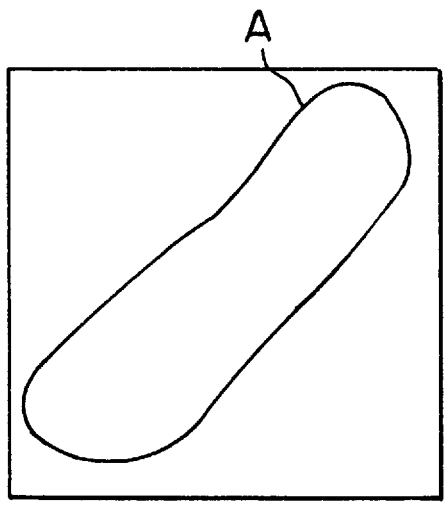
FIGS. 4(a)–4(d) are views representing SEM images displayed on the viewing screen of a CRT, showing an SEM image produced at a higher magnification (a), an SEM image produced at a lower magnification (b), an SEM image of a different field of view produced at the lower magnification (c), and an SEM image produced at a varied lower magnification (d)
Figure 4B:
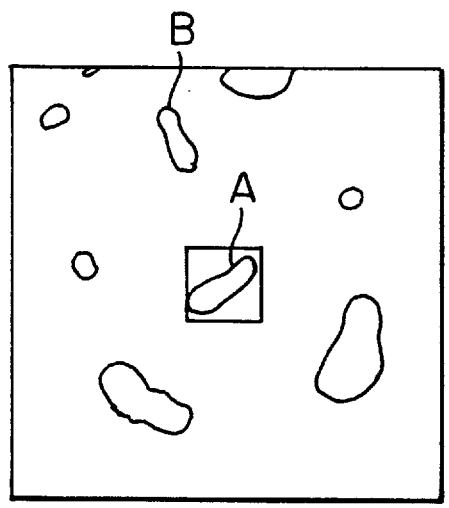
Figure 4C:
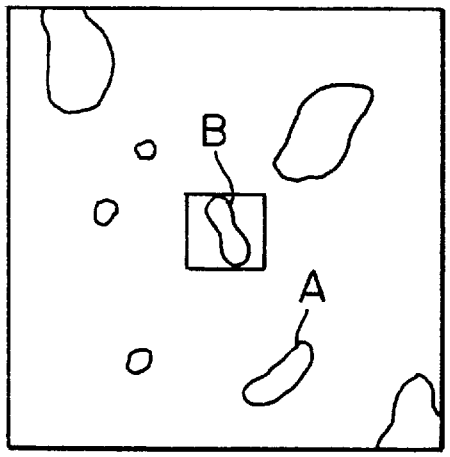
Figure 4D:
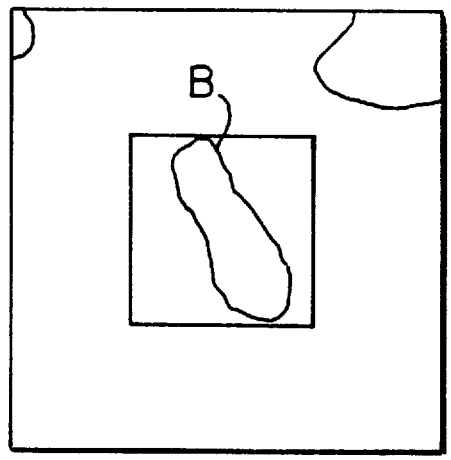

FIG. 3($a$) shows the viewing screen, $I_1$, of the first CRT 15, while FIG. 3($b$) shows the viewing screen, $I_2$, of the second CRT 17. In this case, the magnification $M_1$ is greater than the magnification $M_2$. A frame F having a size $F_2$ is displayed on the viewing screen $I_2$ of the second CRT 17 for the magnification $M_2$.

The instrument is designed so that a frame having a size $F_1$ is displayed on the viewing screen $I_1$ of the first CRT 15 for the magnification $M_1$ but this frame of the size $F_1$ is greater than the size $D_1$ of the viewing screen $I_1$. Therefore, the frame is not displayed in practice.

In this configuration, the operator sets the magnification at $M_2$, for example. A signal representing an image produced at this magnification is stored in the second frame buffer 13 and displayed on the second CRT 17 intact. That is, a still image is displayed. Otherwise, the contents of the frame memory are constantly refreshed by an ever changing image signal. The magnification $M_1$ is set lower than $M_2$. An image produced at this magnification $M_1$ is displayed on the first CRT 15. Concurrently, a frame F used for a comparison of the magnifications is displayed on the first CRT 15. Consequently, the operator easily confirms to what portion of the lower-magnification image does the presently observed, enlarged image correspond.

This magnification $M_1$ is appropriately varied, and the two kinds of images are compared. Hence, the observer easily sees from what portion of the specimen does the higher-magnification ($M_2$) image arise. Of course, if the magnification $M_1$ is changed, the size of the comparison frame displayed on the first CRT 15 varies. Alternatively, the image produced at the lower magnification $M_1$ may be first fixed and then the image produced at the higher magnification may be observed with varying magnification.

Magnifications higher than $M_2$ can be set on the first CRT 15, as well as magnifications lower than $M_2$. Therefore, the image can be displayed at arbitrary magnifications. At the same time, the frame F used for a,comparison of magnifications can be displayed either on the first CRT 15 or on the second CRT 17 according to the magnification. As a result, information about the surroundings of the centered region of the specimen displayed on the second CRT 17 and information about the microstructures of the specimen can be seen on the first CRT 15. Thus, one of the aforementioned requirements can be satisfied. That is, the magnification of the image on the first CRT 15 can be arbitrarily switched irrespective of the fixed value of the magnification $M_2$ Of the image on the second CRT 17.

In this way, the two images to be compared can be magnified and demagnified at will. Also, the size of the scope of the higher-magnification image relative to the size of the lower-magnification image can be readily recognized. Hence, a scanning electron microscope which is easy to handle is provided.

Furthermore, if one image (e.g., the higher-magnification image) is fixed, i.e., the image already stored in the frame buffer is kept displayed, and if the specimen is subsequently shifted to move the observed field of view of the other image (e.g., the lower-magnification image), then the frame F used for a comparison of the magnifications can be kept displayed. This method is convenient to search for details of similar size.

Examples in which fungi are classified are next described by referring to FIGS. 4($a$) and 4($b$). FIG. 4($a$) shows a case in which displayed fungi of interest are enlarged fully, i.e., up to the size of the viewing screen of the first display device. The fungi of interest are indicated by A. FIG. 4($b$) shows a case in which the magnification of the other image of the second displayed device has been lowered. That is, the frame used for a comparison of magnifications is displayed. In this image, many details are seen other than the fungi A. Another microstructure B of the same kind as the fungi A is present.

FIG. 4($c$) shows a case in which the specimen has been so moved that the microstructure B of interest is placed in the center of the viewing screen of the second display device. FIG. 4(d) shows that where the magnification of the second display device is changed, the size of the frame varies accordingly. In this way, if the specimen is moved to search for a desired field of view, or if the magnification is varied for better observation, the size of the frame is varied in response to the specimen movement or variation in the magnification because of a function of the present invention. Consequently, the fungi can be easily distinguished from other kinds of fungi of different sizes. Hence, similar microstructures can be easily found. In this manner, one of the aforementioned requirements are met.

More specifically, if the magnification of the lower-magnification image is switched to other value and the field of view is moved, the operator can easily search the lower-magnification image in a different field of view for microstructures having similar shapes and similar sizes by reference to the magnification comparison frame within the lower-magnification image and to the magnified image.

While the preferred embodiments of the present invention have been described in detail, it is to be understood that the invention is not limited thereto. In the above-described embodiments, secondary electrons are detected. The present invention is also applicable to backscattered electron microscopy in which backscattered electrons are detected and backscattered electron micrographs are displayed. Also in the above embodiments, a frame consisting of lines is superimposed on the lower-magnification image. Means for facilitating the comparison of the magnifications are not limited to the frame. To indicate the size of the other viewing screen, the corners of the frame may be marked with indicia, the frame may be represented in terms of its one, two, or three sides, a certain color may be given to the desired region, or the brightness of the region may be enhanced. Furthermore, in the above embodiments, two CRTs are used to display two kinds of images. The viewing screen of a single CRT may be divided into two to display the two kinds of images.

In the magnification comparison frame display device 21 described above, signals indicating frames according to the sizes $F_1$ and $F_2$ are created and supplied to the adders 14 and 16, respectively, irrespective of the magnification. If the size $F_1$ is larger than the size $D_1$ of the viewing screen, it is only necessary to generate a frame signal corresponding to the size $F_2$ and to supply it to the adder 16. Similarly, if the size $F_2$ is greater than the size $D_2$ of the viewing screen, it is only necessary to generate a frame signal corresponding to the size $F_1$ and to supply it to the adder 14.

Figure 5:
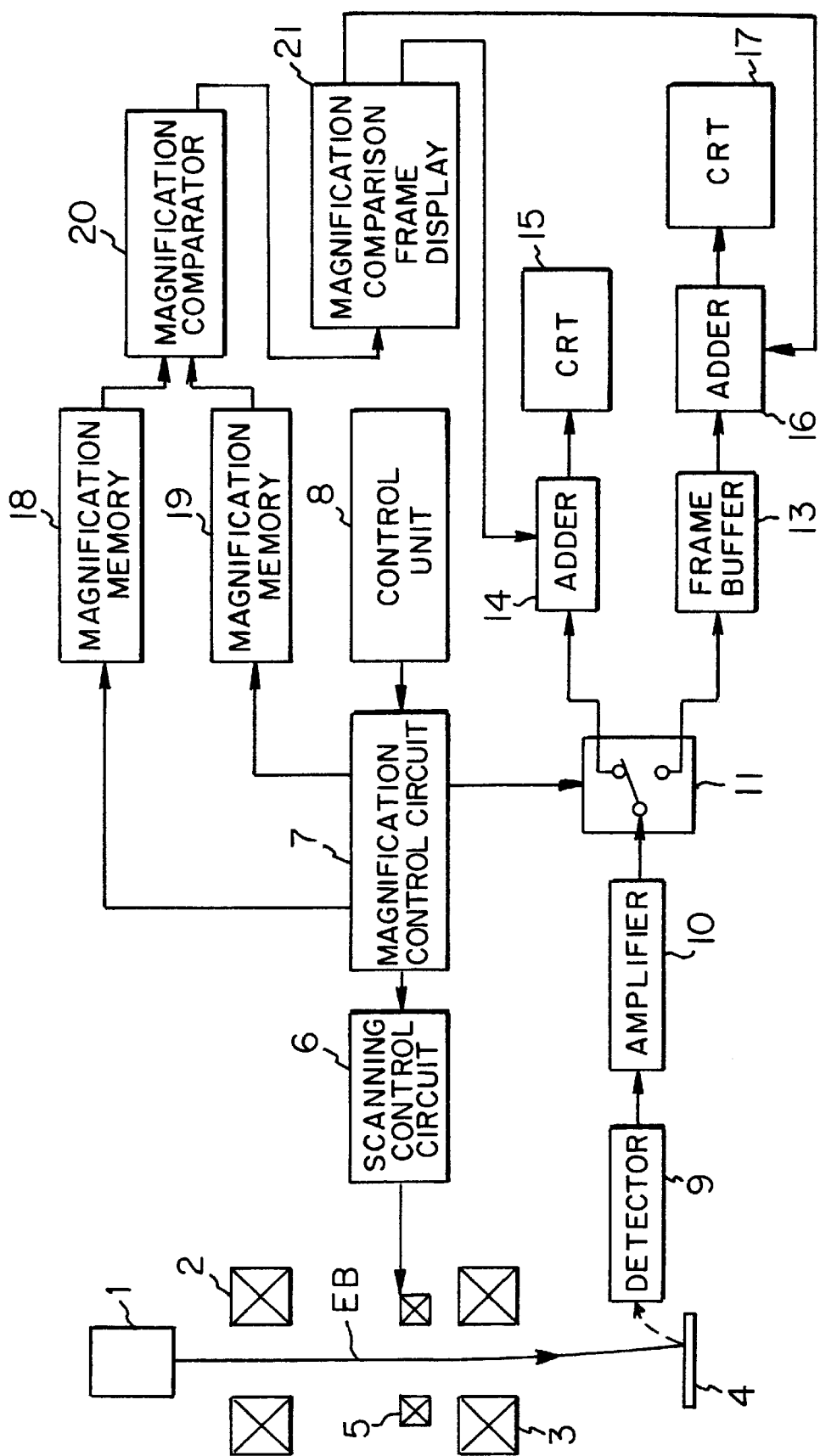
FIG. 5 is a block diagram of another scanning electron microscope in accordance with the invention.

Moreover, as shown in FIG. 5, one image signal may be sent to the CRT via the corresponding adder without using any frame buffer. In this case, the fixed displayed image may be always an image supplied via the frame buffer.

In the scanning electron microscope set forth in claim 1, images produced at different magnifications are displayed simultaneously. The scope of the higher-magnification image is displayed with in the lower-magnification image. The operator wants to compare these two images. One image can be magnified and demagnified at will independent of the magnification of the other. Also, he can easily discern the size of the scope of the higher-magnification image relative to the lower-magnification image.

The scanning electron microscope set forth in claim 3 includes two frame buffers for storing signals representing images produced at two different magnifications $M_1$ and $M_2$. Two kinds of images produced at different magnifications are displayed according to signals from the frame buffers. The ratios $M_1/M_2$ and $M_2/M_1$ are found.

A first discerning signal for indicating the displayed scope of the image produced at the magnification $M_2$ is superimposed on an image signal representing the image produced at the magnification $M_1$, and a second discerning signal for indicating the displayed scope of the image produced at the magnification $M_1$ is superimposed on an image signal representing the image produced at the magnification $M_2$. The first and second discerning signals are created from the ratios $M_1/M_2$ and $M_2/M_1$, respectively. Therefore, the images produced at the different magnifications are displayed at the same time. The scope of the higher-magnification image can be displayed within the lower-magnification image. The operator wants to compare these images produced at the different magnifications. One image can be magnified and demagnified arbitrarily irrespective of the magnification of the other. Also, he can easily discern the size of the scope of the higher-magnification image relative to the lower-magnification image.

The scanning electron microscope set forth in claim 5 includes two frame buffers for storing signals representing images produced at two different magnifications $M_1$ and $M_2$. Two kinds of images produced at different magnifications are displayed according to signals from the frame buffers. The ratio of the lower magnification to the higher magnification is found. A discerning signal indicating the displayed scope of the higher-magnification image is superimposed on the lower-magnification image signal. The discerning signal is created from the found ratio. The images produced at the different magnifications are displayed at the same time. The displayed scope of the higher-magnification image is displayed with in the lower-magnification image. The operator wants to compare these two images. One image can be arbitrarily magnified and demagnified irrespective of the magnification of the other image. Also, he can easily discern the size of the displayed scope of the higher-magnification image relative to the lower-magnification image.

The scanning electron microscope set forth in claim 7 includes a frame buffer for storing a signal representing one of two images produced at two different magnifications $M_1$ and $M_2$. Two kinds of images produced at different magnifications are displayed according to two image signals. The ratios $M_1/M_2$ and $M_2/M_1$ are found from the two magnifications. A first discerning signal indicating the displayed scope of the image produced at the magnification $M_2$ is created from the ratio $M_1/M_2$ and superimposed on the signal representing the image produced at the magnification $M_1$. A second discerning signal indicating the displayed scope of the image produced at the magnification $M_1$ is created from the ratio $M_2/M_1$ and superimposed on the signal representing the image produced at the magnification $M_2$. Therefore, images produced at different magnifications can be displayed simultaneously. The scope of the higher-magnification image can be displayed within the lower-magnification image. The operator wants to compare these two images produced at the different magnifications. One image not read from the frame buffer can be arbitrarily magnified and demagnified independent of the magnification of the other image. Also, he can easily discern the size of the scope of the higher-magnification image relative to the lower-magnification image.

The scanning electron microscope set forth in claim 9 includes a frame buffer for storing a signal representing one of two images produced at two different magnifications. Two kinds of images produced at different magnifications are displayed at the same time according to two image signals. The ratio of the lower magnification to the higher magnification is found. A discerning signal for indicating the scope of the image produced at the higher magnification is created from the ratio and superimposed on a signal representing the image produced at the lower magnification. Thus, the images produced at the different magnifications are displayed at the same time. The scope of the higher-magnification image can be displayed within the lower-magnification image. The operator wants to compare these two images produced at different magnifications. One image not read from the frame buffer can be arbitrarily magnified and demagnified independent of the magnification of the other image. Also, he can easily discern the size of the scope of the higher-magnification image relative to the lower-magnification image.

What is claimed is:

1. A scanning electron microscope having an electron gun for producing and accelerating an electron beam, electron lenses for focusing the electron beam onto a specimen, and scanning means for scanning the electron beam across the specimen in two dimensions to produce signals, said microscope comprising:

means for displaying two images simultaneously and separately according to said signals;

means for permitting one to vary the magnification of either one of said two images irrespective of the magnification of the other image;

calculation means for finding which image of said two images is the lower-magnification image; and means for displaying the scope of the other image within the lower-magnification image found by said calculation means.

2. The scanning electron microscope of claim 1, wherein said scope of the other image displayed within said lower-magnification image found by said calculation means is represented by a frame.

3. A scanning electron microscope having an electron gun for producing and accelerating an electron beam, electron lenses for focusing the electron beam onto a specimen, and scanning means for scanning the electron beam across the specimen in two dimensions to produce signals, said microscope comprising:

two frame buffers for storing signals representing images produced at two different magnifications $M_1$ and $M_2$;

display means for displaying two kinds of images produced at said two different magnifications in their respective scopes according to said signals from said frame buffers;

a calculation means for finding ratios $M_1/M_2$ and $M_2/M_1$ from the two magnifications;

a first superimposing means for superimposing a first discerning signal to an image signal representing the image produced at said magnification $M_1$, said first discerning signal being created from said ratio $M_1/M_2$, said first discerning signal indicating the scope of the image produced at said magnification $M_2$; and a second superimposing means for superimposing a second discerning signal to an image signal representing said image produced at said magnification $M_2$, said second discerning signal being created from said ratio $M_2/M_1$, said second discerning signal indicating the scope of the image produced at said magnification $M_1$.

4. The scanning electron microscope of claim 3, wherein said scope of the image having the higher magnification is displayed within the image having the lower magnification.

5. A scanning electron microscope having an electron gun for producing and accelerating an electron beam, electron lenses for focusing the electron beam onto a specimen, and scanning means for scanning the electron beam across the specimen in two dimensions to produce signals, said microscope comprising:

two frame buffers for storing signals representing a lower-magnification image and a higher-magnification image produced at a lower magnification and at a higher magnification, respectively;

display means for displaying said images produced at said higher and lower magnifications in their respective scopes according to said signals from said frame buffers;

a calculation means for calculating the ratio of the lower magnification to the higher magnification; and a superimposing means for superimposing a discerning signal upon the signal representing the lower-magnification image, said discerning signal indicating the scope of the higher-magnification image, said discerning signal being created from said calculated ratio.

6. The scanning electron microscope of claim 5, wherein said scope of said higher-magnification image displayed within said lower-magnification image is represented by a frame.

7. A scanning electron microscope having an electron gun for producing and accelerating an electron beam, electron lenses for focusing the electron beam onto a specimen, and scanning means for scanning the electron beam across the specimen in two dimensions to produce signals, said microscope comprising:

a frame buffer for storing a signal representing one image produced at one of two different magnifications $M_1$ and $M_2$;

display means for displaying two kinds of images produced at said two different magnifications in their respective scopes according to signals representing two different images;

a calculation means for finding ratios $M_1/M_2$ and $M_2/M_1$ from said two magnifications;

a first superimposing means for superimposing a first discerning signal to an image signal representing the image produced at said magnification $M_1$, said first discerning signal being created from said ratio $M_1/M_2$, said first discerning signal indicating the scope of the image produced at said magnification $M_2$; and a second superimposing means for superimposing a second discerning signal upon an image signal representing the image produced at said magnification $M_2$, said second discerning single being created from said ratio $M_2/M_1$, said second discerning signal indicating the scope of the image produced at said magnification $M_1$.

8. The scanning electron microscope of claim 7, wherein said scope of the image having the higher magnification is displayed within the image having the lower magnification.

9. A scanning electron microscope having an electron gun for producing and accelerating an electron beam, electron lenses for focusing the electron beam onto a specimen, and scanning means for scanning the electron beam across the specimen in two dimensions to produce signals, said microscope comprising:

a frame buffer for storing a signal representing one image produced at one of a higher magnification and a lower magnification;

display means for displaying images produced at said higher and lower magnifications in their respective scopes according to two image signals;

a calculation means for finding the ratio of the lower magnification to the higher magnification; and a superimposing means for superimposing a discerning signal upon the signal representing the image produced at said lower magnification, said discerning signal indicating the scope of the image produced at said higher magnification, said discerning signal being created from said found ratio.

10. The scanning electron microscope of claim 9, wherein said scope of said image produced at said higher magnification is displayed within said image produced at said lower magnification.

* * * * *

UNITED STATES PATENT AND TRADEMARK OFFICE
CERTIFICATE OF CORRECTION

PATENT NO. : 5,834,774
DATED : November 10, 1998
INVENTOR(S) : Negishi et al.

It is certified that error appears in the above-identified patent and that said Letters Patent is hereby corrected as shown below:

Column 4, Line 15 "stored -in" should read --stored in--.

Column 6, Line 30 "a,comparison" should read --a comparison--.

Column 6, Line 39 "$M_2$ Of" should read --$M_2$ of--.

Column 6, Line 60 before "image" delete "other".

Column 6, Line 61 replace "displayed" with --display--.

Column 7, Line 56 replace "with in" with --within--.

Column 8, Line 31 replace "with in" with --within--.

Signed and Sealed this

Eighteenth Day of May, 1999

Attest:

Q. TODD DICKINSON

*Attesting Officer*                *Acting Commissioner of Patents and Trademarks*